(12) United States Patent
Perry et al.

(10) Patent No.: US 6,442,035 B1
(45) Date of Patent: Aug. 27, 2002

(54) CARD CAGE WITH INTEGRAL CARD GUIDES

(75) Inventors: Joseph C. Perry, Colleyville; Charles W. Atchison, Sanger, both of TX (US)

(73) Assignee: Marconi Communications, Inc., Cleveland, OH (US)

( * ) Notice: Subject to any disclaimer, the term of this patent is extended or adjusted under 35 U.S.C. 154(b) by 0 days.

(21) Appl. No.: 09/703,114

(22) Filed: Oct. 31, 2000

(51) Int. Cl.[7] .............................. H05K 5/04; H05K 7/20; B65D 85/86
(52) U.S. Cl. ................. 361/756; 361/720; 361/797; 361/694; 211/41.17; 211/73; 211/135; 312/350; 206/706; 206/707
(58) Field of Search ...................... 361/753, 797, 361/687, 690, 692, 693, 720, 721; 211/41.17, 41.18, 70, 71, 72, 73, 85, 134, 135, 153, 162; 454/184; 312/349, 350, 351, 352, 258; 206/701–726; 220/4

(56) References Cited

U.S. PATENT DOCUMENTS

| | | | | |
|---|---|---|---|---|
| 3,664,510 A | * | 5/1972 | Kerschbaum | 211/41 |
| 3,696,936 A | * | 10/1972 | Straccia | 211/41 |
| 4,519,016 A | * | 5/1985 | Bradley | 361/802 |
| 5,219,443 A | * | 6/1993 | Stoerk | 312/233.6 |
| 5,256,086 A | * | 10/1993 | Ponn | 439/607 |
| 5,696,668 A | * | 12/1997 | Zenitani | 361/802 |

* cited by examiner

Primary Examiner—David S. Martin
Assistant Examiner—Michael L. Lindinger
(74) Attorney, Agent, or Firm—Jones, Day, Reavis & Pogue

(57) ABSTRACT

A one-piece metal card cage has integral card guides provided by rows of formed projections that extend into the interior of the cage. The projections are hollow to provide ventilation openings through which air may flow to and from the interior of the cage. The card cage is fabricated from a one-piece sheet metal blank that is folded and joined together to provide top and bottom walls, opposite sidewalls, a backwall and a front opening.

20 Claims, 8 Drawing Sheets

CARD CAGE WITH INTEGRAL CARD GUIDES

BACKGROUND OF THE INVENTION

This application relates to the art of card cages and, more particularly, to card cages for supporting a plurality of side-by-side vertical circuit cards. The invention is particularly applicable for use with telephone power distribution and switching circuits, and will be described with particular reference thereto. However, it will be appreciated that the improved card cage of the present application can be used for other purposes and for supporting other types of circuit cards.

Card cages for supporting circuit cards commonly are fabricated from a plurality of individual components. Plural components and large openings for ventilation may reduce the effectiveness of the card cage in satisfying electromagnetic compliance requirements.

It would be desirable to have an improved card cage that is easy to fabricate and that minimizes any leakage of electromagnetic emissions.

SUMMARY OF THE INVENTION

A one-piece metal card cage in accordance with the present application is fabricated from a single piece of sheet metal to have top and bottom walls, opposite sidewalls, a backwall and a front opening.

In a preferred arrangement, the sidewalls include upper and lower sidewall portions that respectively are integral with the top and bottom walls. The upper and lower sidewall portions are secured together along overlapping sidewall portions, at least one of which is laterally offset from the other.

A plurality of projection rows are formed in the top and bottom walls, and extend into the interior of the card cage to provide guide channels that receive top and bottom edge portions of circuit cards. The projection rows extend in a direction between the sidewalls and are spaced from one another in a direction between the front opening and the backwall.

Each projection row is formed by a plurality of individual hollow projections that are spaced from one another in a direction between the sidewalls to define guide channels therebetween for receiving upper and lower edge portions of circuit cards. The hollow projections provide flow of ventilation air in and out of the card cage.

The projection rows include a pair of front projection rows that are located closely adjacent to the front opening. The pair of front projection rows are positioned closer to one another than the remainder of the projection rows so that the guide channels are very close together and prevent skewing of a circuit card as it is inserted into the card cage.

The hollow projections preferably are generally cylindrical although other shapes may be used.

It is a principal object of the invention to provide an improved card cage.

It is also an object of the invention to provide an improved card cage that reduces electromagnetic emissions while providing good stiffness and ventilation air flow.

It is a further object of the invention to provide a one-piece metal card cage that minimizes the number and size of card guide slots and open areas so that leakage of electromagnetic emissions is minimized.

DESCRIPTION OF A PREFERRED EMBODIMENT

Figure 1:
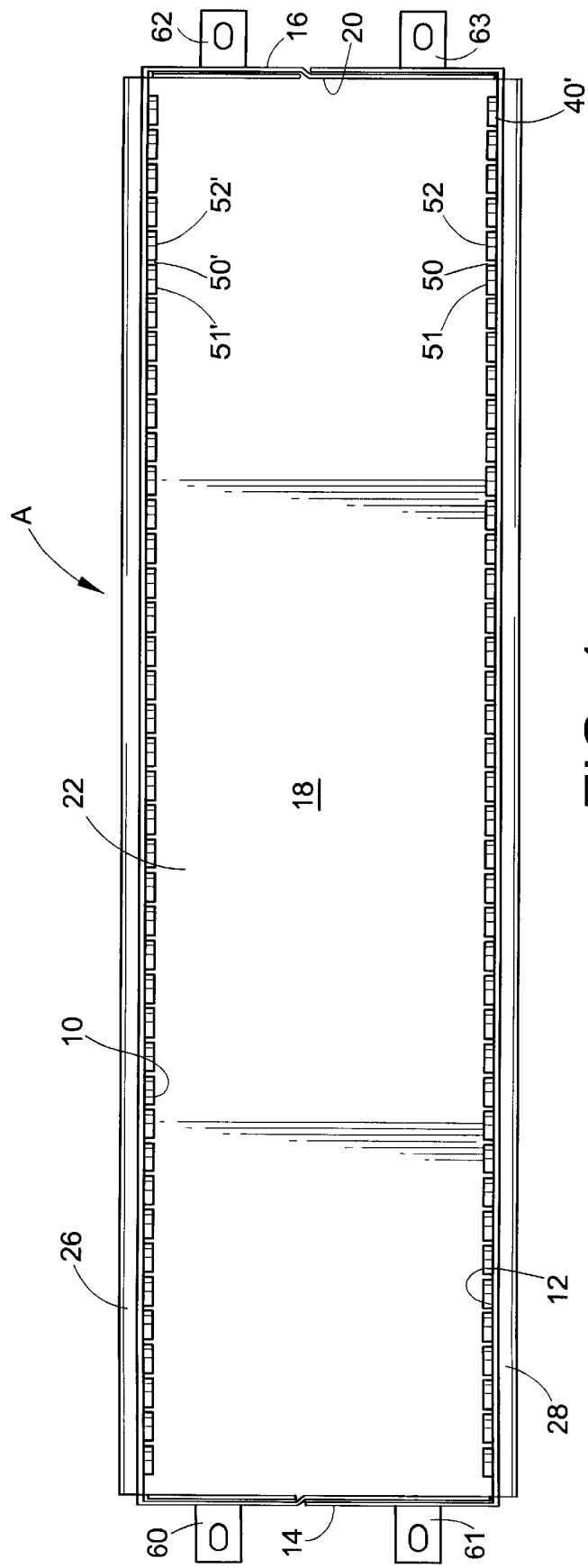
FIG. 1 is a front elevational view of a card cage constructed in accordance with the present application.

Referring now to the drawing, whereon the showings are for purposes of illustrating a preferred embodiment of the invention only and not for purposes of limiting same, card cage A is in the general form of a rectangular solid having parallel top and bottom walls 10, 12, opposite sidewalls 14, 16, a backwall 18 and a front opening 20. The various walls surround an interior space 22 to which access is provided through front opening 20.

Figure 3:
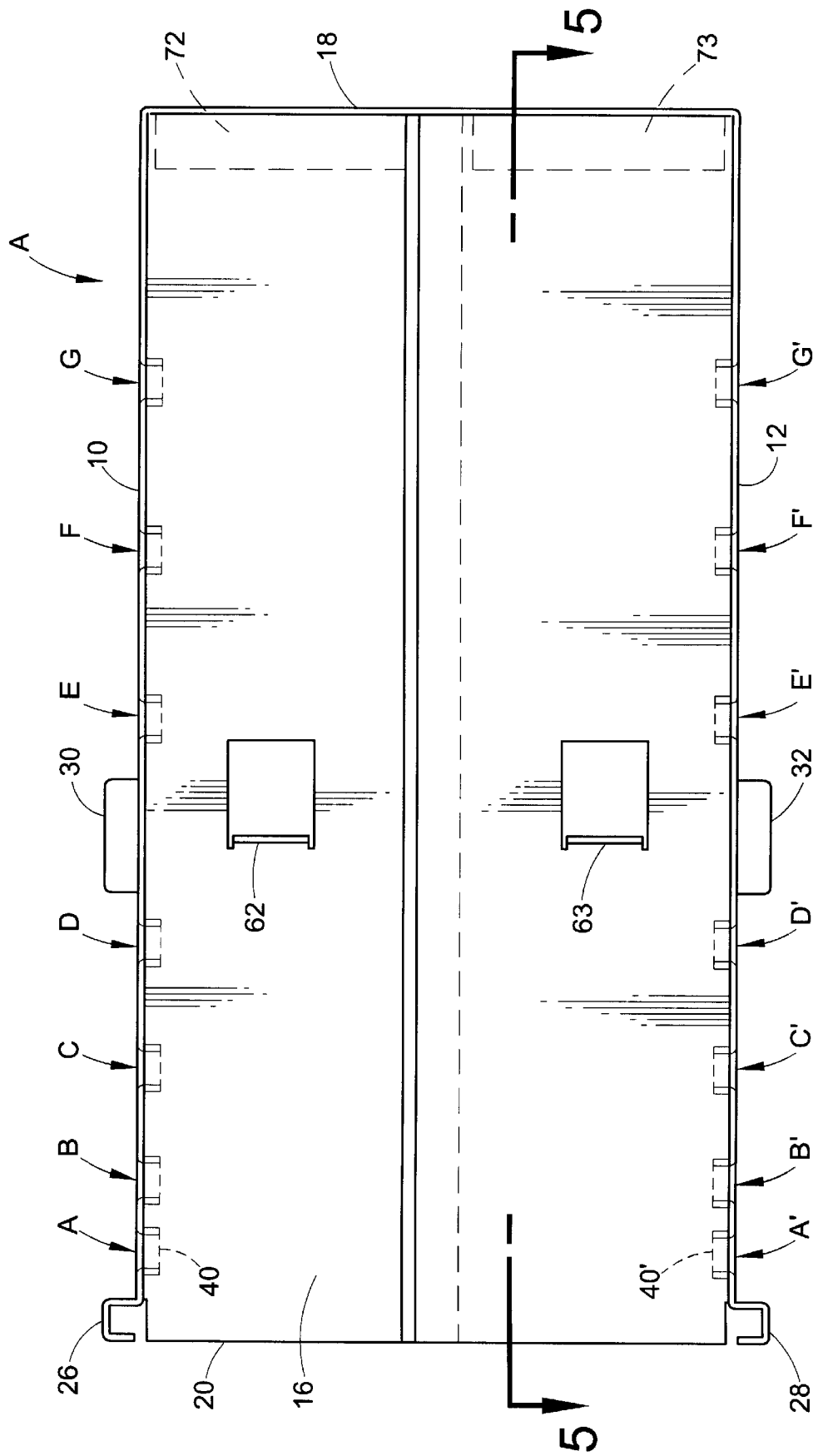
FIG. 3 is a side elevational view thereof.
Figure 4:
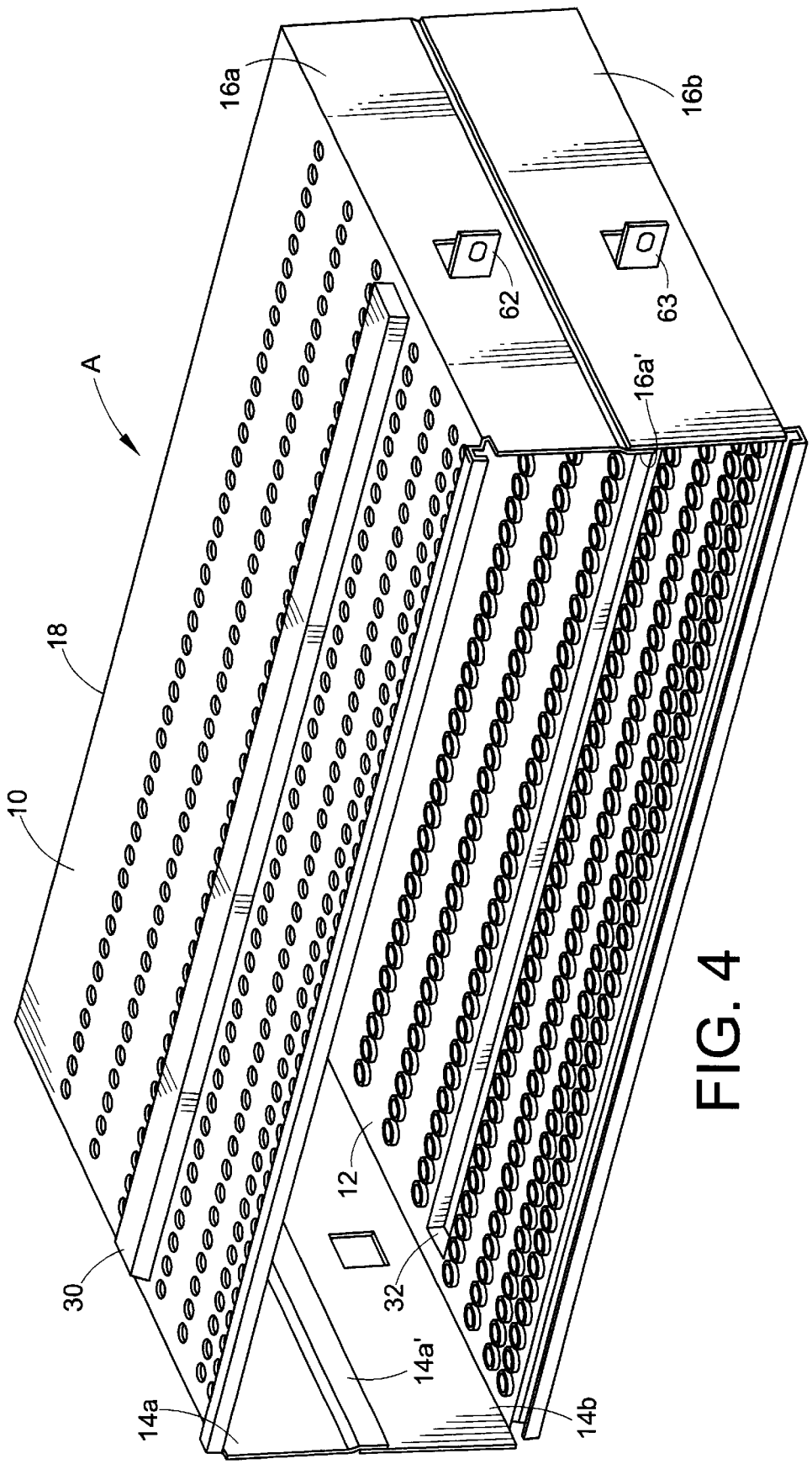
FIG. 4 is a perspective illustration thereof.
Figure 6:
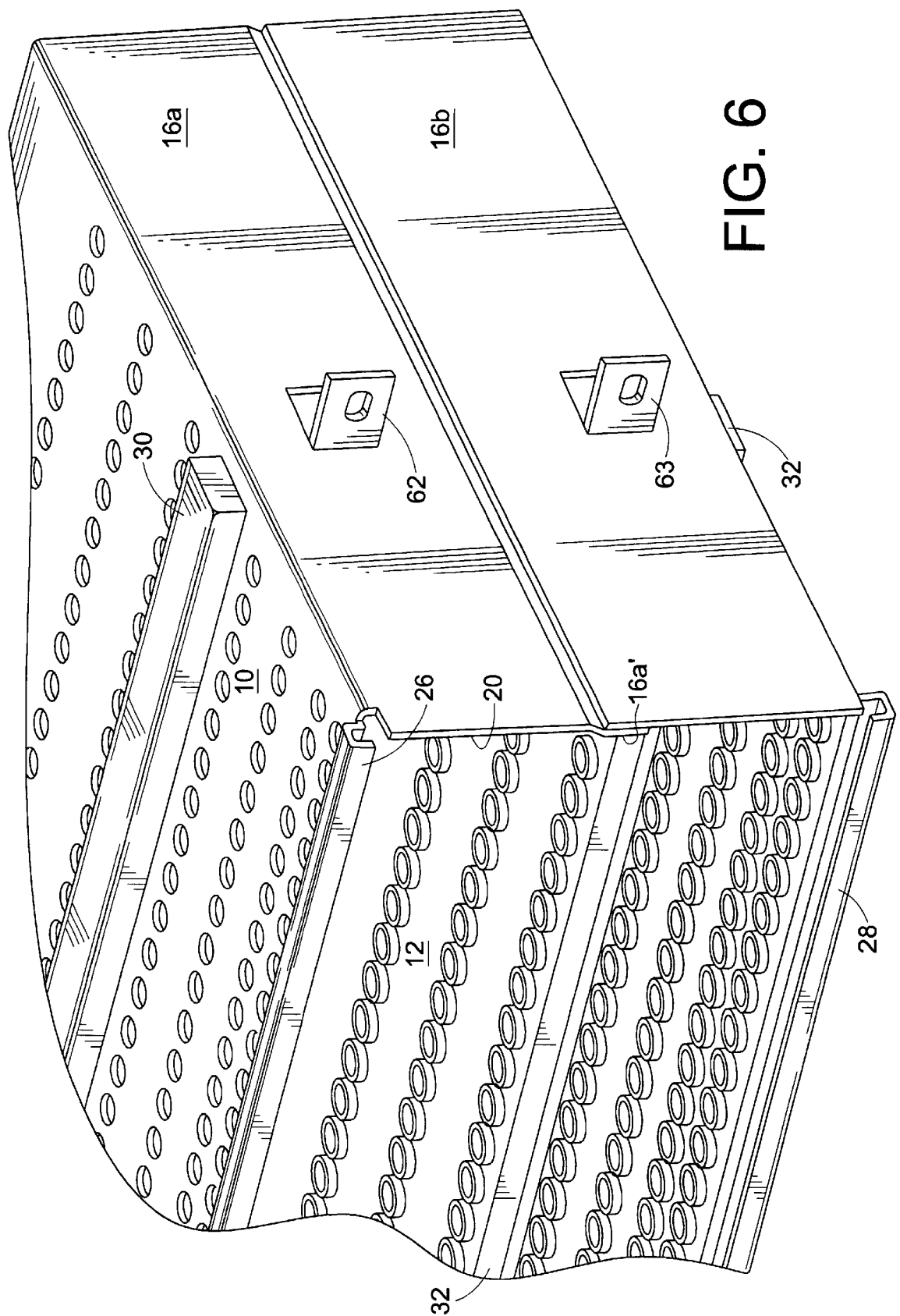
FIG. 6 is a partial perspective illustration looking into the front opening of the card cage of the present application.

Top and bottom channels 26, 28 formed integrally with top and bottom walls 10, 12 extend above and below front opening 20 between opposite sidewalls 14, 16 to add structural stiffness to the card cage and provide supports for the use of typical inserter/extractor card ejectors. Channels 26, 28 open toward one another as shown in FIGS. 3 and 6.

Top and bottom stiffening channels 30, 32 extend across top and bottom walls 10, 12 between sidewalls 14, 16. Stiffening channels 30, 32 are located intermediate front opening 20 and backwall 18 to provide further stiffness for the card cage. Stiffening channels 30, 32 are stamped integral with top and bottom walls 10, 12 and extend outwardly therefrom away from the interior space of the card cage as best shown in FIG. 3.

Figure 2:
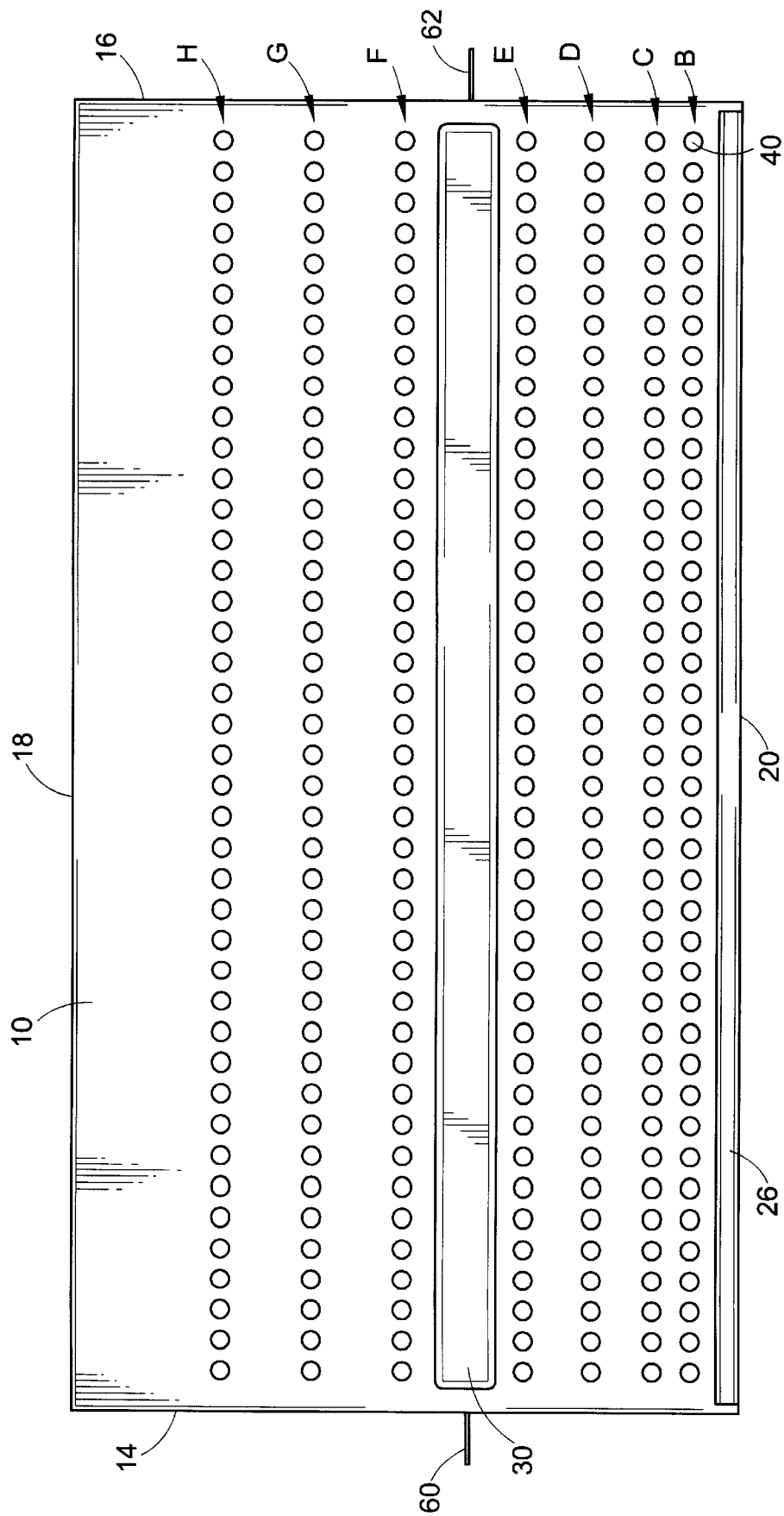
FIG. 2 is a top plan view thereof.

Top and bottom walls 10, 12 are provided with a plurality of rows of hollow stamped projections that extend into interior space 22 of the card cage. FIG. 2 shows rows of hollow stamped projections B–H in top wall 10. Bottom wall 12 has corresponding rows of projections that are identified by the same letters with a prime in other figures. Individual projections in the top and bottom walls are vertically aligned with one another.

Each projection row extends in a direction between opposite sidewalls 14, 16 and the rows are spaced-apart from one another in a direction between front opening 20 and backwall 18. A pair of front projection rows B, C are positioned closer to one another than the remaining projection rows. Each hollow projection in each row is of the same size and shape, and only one such projection is generally indicated at 40 in row B. The aligned projection in bottom wall 12 is indicated at 40' in bottom wall 12.

The projections and projection rows in top and bottom walls 10, 12 are in vertical alignment with one another. The projections in each row also are in alignment with one another from front opening 20 to backwall 18 in a direction parallel to opposite sidewalls 14, 16. Thus, each pair of adjacent hollow projections in each row provides a card guide channel therebetween indicated at 50 and 50a–50f in FIG. 2 between adjacent hollow projections 51 and 51a–51f and 52 and 52a–52f. A flat rectangular circuit card that is vertically oriented is insertable through front opening 20 with its upper and lower edge portions received in the vertically aligned card guide channels 50 and 50a–50f extending front-to-rear on the inside of top and bottom walls 10, 12.

The projections and projection rows in top and bottom walls 10, 12 are in vertical alignment with one another. The projections in each row also are in alignment with one another from front opening 20 to backwall 18 in a direction parallel to opposite sidewalls 14, 16. Thus, each pair of adjacent hollow projections in each row provides a card guide channel therebetween as indicated at 50–50f in FIG. 5 between adjacent hollow projections 51–5f and 52–52f. A flat rectangular circuit card that is vertically oriented is insertable through front opening 20 with its upper and lower edge portions received in the vertically aligned card guide channels 50–50f extending front-to-rear on the inside of top and bottom walls 10, 12.

Side walls 14, 16 have outwardly extending vertical flanges 60, 61 and 62, 63 extending outwardly therefrom perpendicular thereto for attaching card cage A to vertical supports. Suitable holes are provided through flanges 60–63 for receiving fasteners to attach the card cage to a vertical support.

Figure 8:
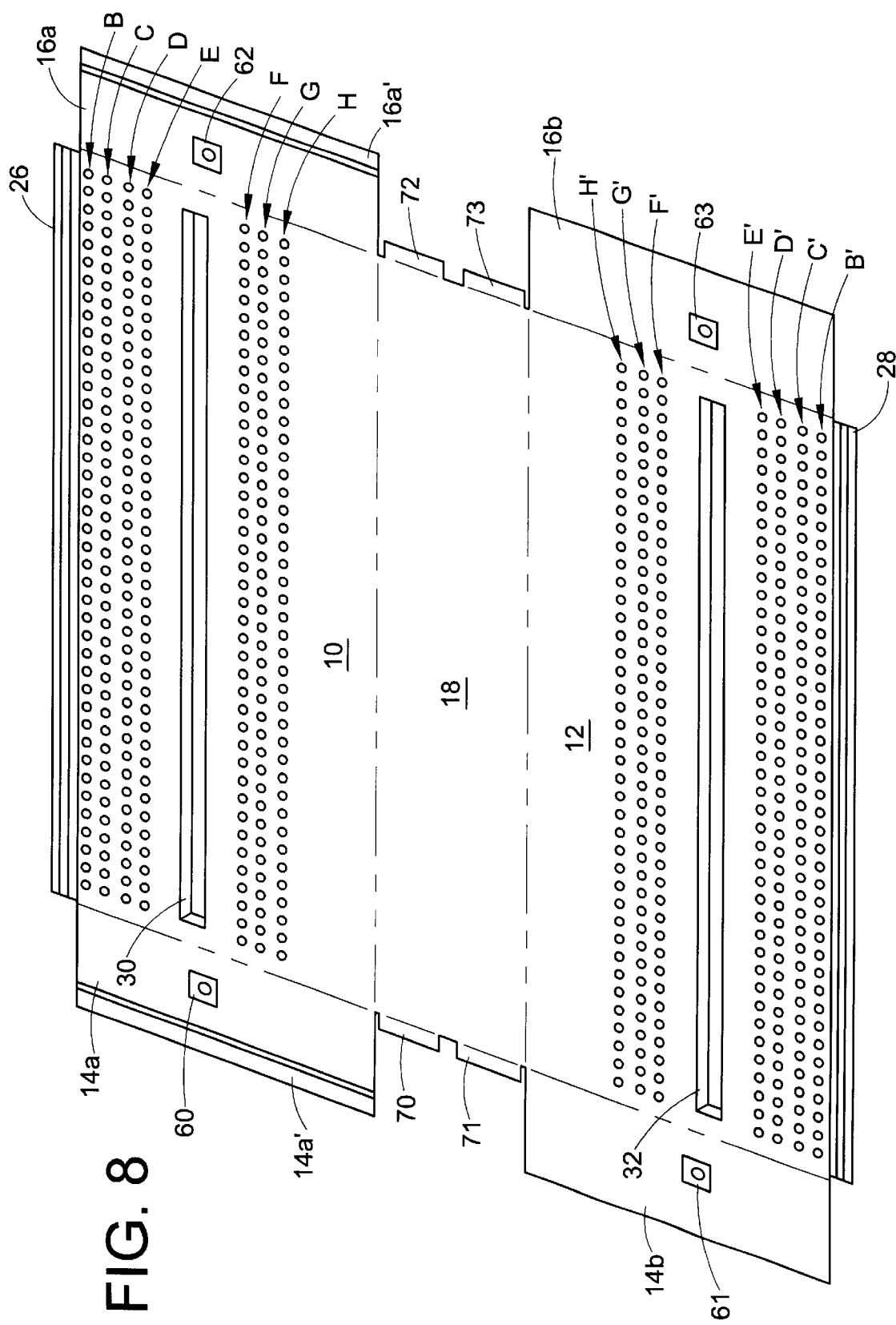
FIG. 8 is a perspective illustration of a metal blank used to fabricate the card cage of FIGS. 1–5.

FIG. 8 shows the one-piece metal blank from which the card cage is fabricated. Back wall 18 has assembly flanges 70, 71 and 72, 73 thereon that are bent perpendicular to backwall 18 and positioned inside of the sidewalls when they are bent perpendicular to the top and bottom walls. Sidewall 14 is formed by upper and lower sidewall portions 14a, 14b, while sidewall 16 is formed by upper and lower sidewall portions 16a, 16b.

Figure 5:
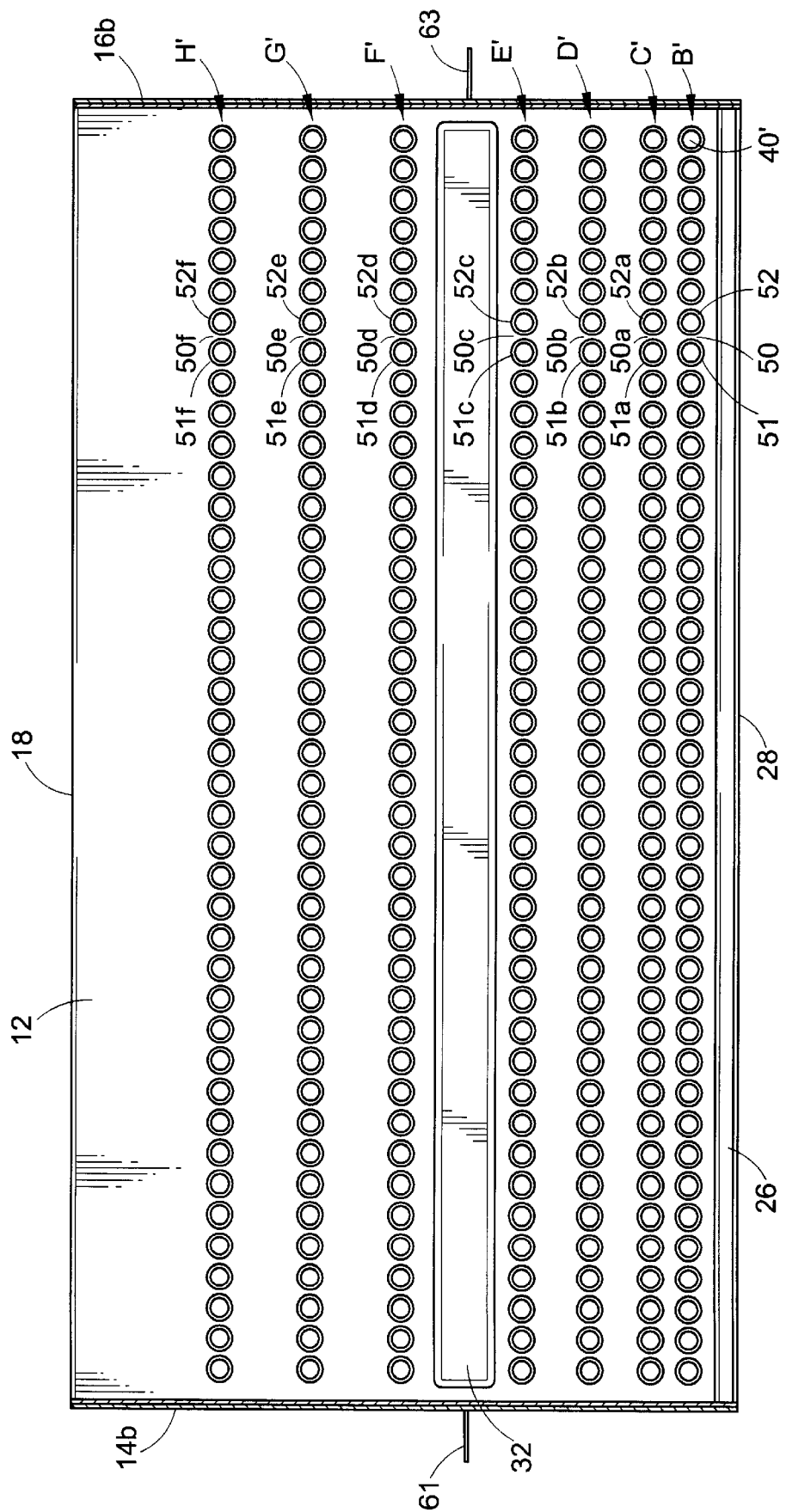
FIG. 5 is a cross-sectional plan view taken generally on line 5—5 of FIG. 3.
Figure 7:
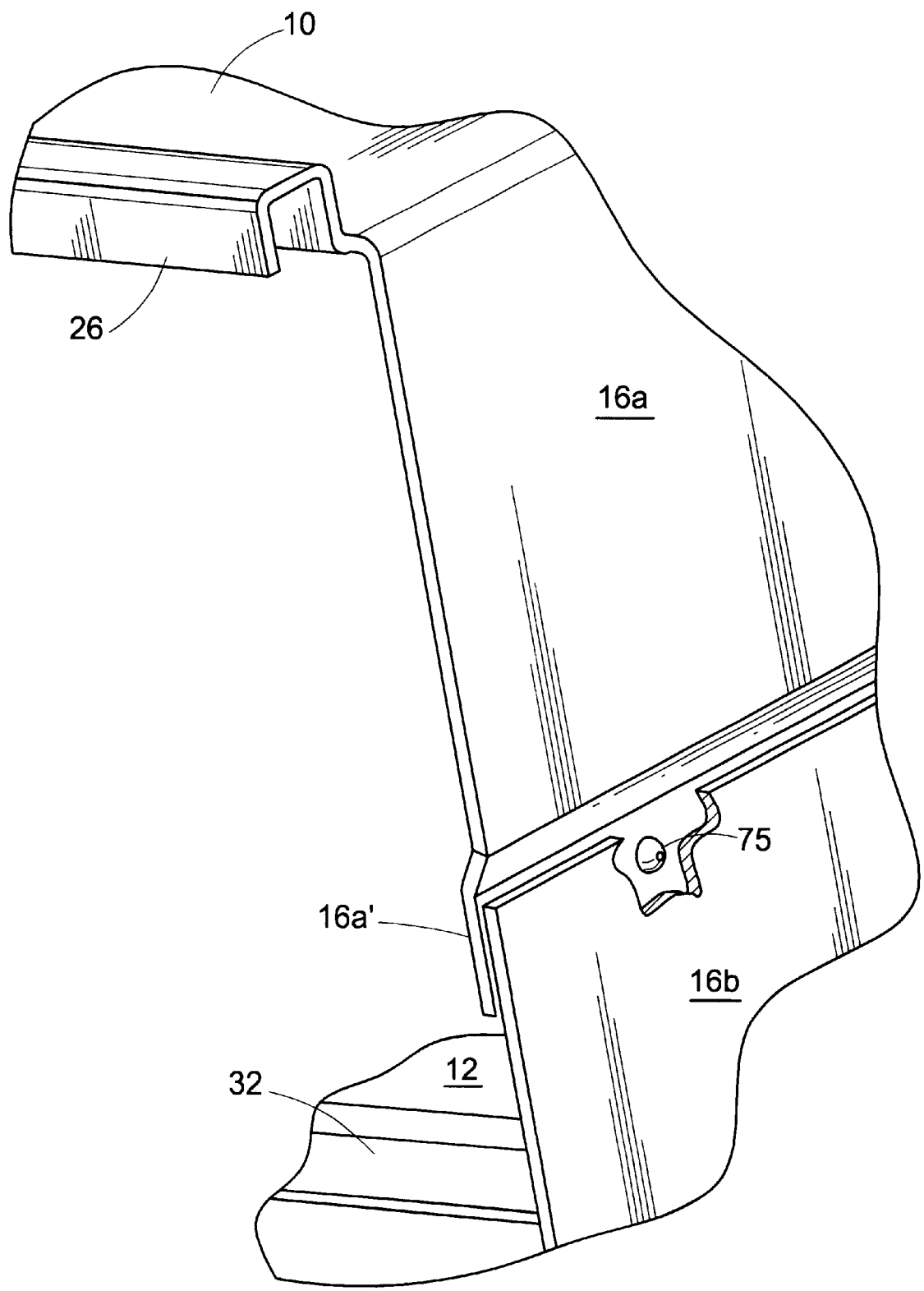
FIG. 7 is a partial perspective illustration showing overlapping portions between upper and lower sidewalls on the card cage.

As shown in FIG. 5, upper and lower sidewalls 16a, 16b have vertically overlapping sidewall portions that are secured together by welding or the use of fasteners. At least one overlapping portion 14a', 16a' is offset laterally toward the interior of the card cage by the thickness of the sheet metal so that the sidewall portions extend perpendicular to the top and bottom walls. A plurality of dimples may be formed in overlapping portions 14a', 16a' extending toward the corresponding overlapping portion on lower sidewall portion 14b, 16b to facilitate spot welding or otherwise securing together the overlapping portions and one such dimple is indicated at 75 in FIG. 7.

Although the individual projections preferably are generally cylindrical, it will be recognized that hollow tubular shapes other than cylindrical can be used so that the projections perform the dual functions of providing card guide channels and ventilation openings.

The card cage and projections of the present application may have a variety of different dimensions depending on the use to which it will be put and the size of the circuit cards that it receives. Some dimensions will be provided simply by way of example and not necessarily by way of limitation.

Each generally cylindrical tubular projection has an external diameter of 0.425 inch and an internal diameter of 0.300 inch. The projections in each row are spaced on centers of 0.500 inch so that the width of the card guide channels between adjacent projections is 0.075 inch for receiving circuit cards having a nominal thickness of 0.062 inch. The height of each projection, from the outside surface of either the top or bottom walls to the projection end, is 0.203 inch. The card cage may be fabricated from steel sheet metal having a thickness from 0.047 inch to 0.062 inch. Obviously, other metals and metal thicknesses may be used.

The center of first projection row B is located 0.800 inch from the outer periphery of front opening 20. Front pair of rows B, C are spaced on 0.625 centers. The centers of rows C and D are spaced 1.000 inch apart. The centers of rows D and E are spaced 1.125 inch apart. The centers of rows E and F are spaced 2.000 inches apart. The centers of rows F and G are spaced 1.500 inch apart. The centers of rows G and H are spaced 1.500 inch apart. The center of row H is spaced 3.250 inches from the exterior surface of backwall 18.

The card cage has a height between the exterior surfaces of top and bottom walls 10, 12 of 5.416 inches. The depth of the card cage from the periphery of front opening 20 to the exterior surface of backwall 18 is 11.000 inches. The width of the card cage across the exterior surfaces of sidewalls 14, 16 is 21.312 inches. Stiffening channels 30, 32 project 0.300 inch outwardly from the exterior surfaces of top and bottom walls 10, 12. The stiffening channels have a generally rectangular cross-sectional shape and a width of 1.000 inch. The longitudinal centerline of each stiffening channel 30, 32 is spaced 4.500 inches from the periphery of front opening 20. Thus, the centerline of each stiffening channel is spaced 1.000 inch toward front opening 20 from the front-to-back center of the card cage.

In the arrangement shown and described, each row of projections has 41 projections providing 40 card guide channels therebetween. Four of the seven projection rows are located between the stiffening ribs and the periphery of the front opening, and three are located between the stiffening ribs and the card cage backwall. Obviously, different dimensions and spacings may be used without departing from the invention.

The spacing between the projection rows that are located toward the front of the cage is much closer than the spacing between the projection rows that are located toward the back of the cage. This facilitates insertion of the cards without sideways skewing because the card guide channels between the two front rows are very close together. The cylindrical shape of the projections provides cam-like entrance openings with the curved peripheral surfaces of adjacent projections converging toward the guide channels just inside the card cage front opening. The entrance openings of the vertically aligned upper and lower guide channels are clearly shown in FIG. 1.

Although the invention has been shown and described with reference to a preferred embodiment, it is obvious that equivalent alterations modifications will occur to others skilled in the art upon the reading and understanding of this specification. The present invention includes all such equivalent alterations and modifications and is limited only by the scope of the claims.

We claim:

1. A one-piece metal card cage comprising a generally rectangular enclosure having a front opening to an interior space, said enclosure including top and bottom walls, opposite sidewalls and a backwall opposite from said front opening, a plurality of projection rows formed integrally in said top and bottom walls and extending into said interior space, said projection rows extending between said opposite sidewalls and being spaced-apart between said front opening and said backwall, each row of projections in said projection rows having a plurality of projections spaced-apart from one another in a direction extending between said sidewalls to define a plurality of card guide channels extending in a direction between said front opening and said backwall for receiving upper and lower edge portions of circuit cards, said guide channels in said projection rows being aligned in a direction extending between said front opening and said backwall, and said projections having ventilation openings therein.

2. The card cage of claim 1 wherein said projections are hollow cylinders having internal passages that form said ventilation openings.

3. The card cage of claim 2 wherein said projection rows include a pair of front projection rows closely adjacent said front opening, said pair of front projection rows being positioned closer together than the remainder of the rows in said projection rows.

4. The card cage of claim 3 including at least one stiffening rib formed integrally with each of said top and bottom walls and projecting away from said interior space, said stiffening ribs being located intermediate said front opening and said backwall and extending in a direction between said sidewalls.

5. The card cage of claim 4 including a plurality of mounting flanges formed integrally with each of said sidewalls and extending outwardly therefrom away from said interior space.

6. The card cage of claim 5 wherein each of said sidewalls includes an upper sidewall portion that is integral with said top wall and a lower sidewall portion that is integral with said bottom wall.

7. The card cage of claim 6 wherein said upper and lower sidewall portions overlap one another along overlapping portions and at least one of said overlapping portions is laterally offset from the other in a direction extending between said sidewalls.

8. The card cage of claim 7 including a plurality of spaced-apart dimples in at least one of said overlapping portions extending toward the other of said overlapping portions.

9. The card cage of claim 1 wherein said projections are hollow tubes through which air flows in and out of said interior space.

10. The card cage of claim 1 wherein said projection rows include a pair of front projection rows closely adjacent said front opening, said pair of front projection rows being positioned closer together than the remainder of the rows in said projection rows.

11. The card cage of claim 1 including at least one stiffening rib formed integrally with each of said top and bottom walls and projecting away from said interior space, said stiffening ribs being located intermediate said front opening and said backwall and extending in a direction between said sidewalls.

12. The card cage of claim 1 wherein each of said sidewalls includes an upper sidewall portion that is integral with said top wall and a lower sidewall portion that is integral with said bottom wall.

13. The card cage of claim 12 wherein said upper and lower sidewall portions overlap one another along overlapping portions and at least one of said overlapping portions is laterally offset from the other in a direction extending between said sidewalls.

14. A metal card cage including an interior space between top and bottom walls having a plurality of integral hollow tubular projections extending into said interior space, said projections being spaced-apart to provide card guide channels therebetween for receiving upper and lower edge portions of a circuit card, and said projections providing flow of ventilation air therethrough to and from said interior space.

15. The card cage of claim 14 wherein said card cage is fabricated in one-piece by folding a sheet metal blank to provide said card cage with said top and bottom walls along with opposite sidewalls and a backwall.

16. The card cage of claim 15 wherein said sidewalls include overlapping upper and lower sidewall portions.

17. The card cage of claim 14 wherein said tubular projections are generally cylindrical.

18. The card cage of claim 14 wherein said card cage has opposite sidewalls and a backwall extending between said top and bottom walls, said projections being arranged in a plurality of parallel projection rows extending in a direction between said sidewalls, said card cage having a front opening and said projection rows being spaced from one another in a direction between said front opening and said backwall, said projection rows including a pair of front projection rows located adjacent said front opening and being positioned closer together than the remainder of said projection rows.

19. The card cage of claim 18 including at least one stiffening channel in integral with each of said bottom walls extending between said sidewalls and located intermediate said front opening and said backwall, said stiffening channels extending outwardly from said top and bottom walls away from said interior space.

20. The card cage of claim 19 including mounting flanges integral with said sidewalls extending outwardly therefrom.

* * * * *